United States Patent
Ishidoshiro et al.

(10) Patent No.: US 7,145,801 B2
(45) Date of Patent: Dec. 5, 2006

(54) EXTERNAL STORAGE DEVICE

(75) Inventors: Takashi Ishidoshiro, Aichi-ken (JP); Yoshiiku Sonobe, Gifu (JP)

(73) Assignee: Buffalo Inc., Nagoya (JP)

( * ) Notice: Subject to any disclaimer, the term of this patent is extended or adjusted under 35 U.S.C. 154(b) by 0 days.

(21) Appl. No.: 11/031,985

(22) Filed: Jan. 7, 2005

(65) Prior Publication Data

US 2005/0281088 A1  Dec. 22, 2005

(30) Foreign Application Priority Data

Jan. 9, 2004  (JP)  ............................. 2004-004097

(51) Int. Cl.
*G11C 11/34*  (2006.01)
(52) U.S. Cl. ............................. 365/185.11; 365/185.33
(58) Field of Classification Search .......... 365/185.11, 365/185.33, 189.08, 189.12
See application file for complete search history.

(56) References Cited

U.S. PATENT DOCUMENTS

| | | | | |
|---|---|---|---|---|
| 5,361,228 A | * | 11/1994 | Adachi et al. | 365/189.03 |
| 5,732,208 A | * | 3/1998 | Tamura et al. | 714/28 |
| 6,477,671 B1 | * | 11/2002 | Wada et al. | 714/718 |
| 6,735,638 B1 | * | 5/2004 | Hisano | 710/5 |

* cited by examiner

*Primary Examiner*—Anh Phung
(74) *Attorney, Agent, or Firm*—Beyer Weaver & Thomas, LLP

(57) ABSTRACT

By providing registers for each block constituting the flash memory, based on the use state and the erase count information stored in the registers, the plurality of blocks are classified into n groups according to the erase count by the control circuit, and of the blocks that can be used for writing of one classified group, writing of data is performed in the block constitution sequence. When all the blocks of one group are used, data is written to blocks that can be used for writing of another group selected in a specified sequence. Sequentially between n groups, the item in charge for selecting the blocks used for data writing are alternated, and data is written to the selected block. As a result, considering leveling of the flash memory block erase count, it is possible to perform the write capability block selection process using hardware.

13 Claims, 11 Drawing Sheets

| Input Value | | | | Block No. | | |
|---|---|---|---|---|---|---|
| A3 (B3) | A2 (B2) | A1 (B1) | A0 (B0) | O1 | O2 | |
| X | X | X | 1 | 0 | 0 | #0 block |
| X | X | 1 | 0 | 0 | 1 | #1 block |
| X | 1 | 0 | 0 | 1 | 0 | #2 block |
| 1 | 0 | 0 | 0 | 1 | 1 | #3 block |

Fig.9A
Initial state (no defects)

| Block No. | Defective b3 | In use b2 | Deletion 1 b1 | Deletion 2 b0 | A side input value | B side input value |
|---|---|---|---|---|---|---|
| #0 | 1 | 1 | 1 | 0 | 1 | 0 |
| #1 | 1 | 1 | 1 | 0 | 1 | 0 |
| #2 | 1 | 1 | 1 | 0 | 1 | 0 |
| #3 | 1 | 1 | 1 | 0 | 1 | 0 |
| #4 | 1 | 1 | 1 | 0 | 1 | 0 |
| #5 | 1 | 1 | 1 | 0 | 1 | 0 |
| #6 | 1 | 1 | 1 | 0 | 1 | 0 |
| #7 | 1 | 1 | 1 | 0 | 1 | 0 |
| #8 | 1 | 1 | 1 | 0 | 1 | 0 |
| #9 | 1 | 1 | 1 | 0 | 1 | 0 |
| Second operation γ | | | | | 0 | 1 |

Fig.9B
3 blocks used

| Block No. | Defective b3 | In use b2 | Deletion 1 b1 | Deletion 2 b0 | A side input value | B side input value |
|---|---|---|---|---|---|---|
| #0 | 1 | 0 | 1 | 0 | 0 | 0 |
| #1 | 1 | 0 | 1 | 0 | 0 | 0 |
| #2 | 1 | 0 | 1 | 0 | 0 | 0 |
| #3 | 1 | 1 | 1 | 0 | 1 | 0 |
| #4 | 1 | 1 | 1 | 0 | 1 | 0 |
| #5 | 1 | 1 | 1 | 0 | 1 | 0 |
| #6 | 1 | 1 | 1 | 0 | 1 | 0 |
| #7 | 1 | 1 | 1 | 0 | 1 | 0 |
| #8 | 1 | 1 | 1 | 0 | 1 | 0 |
| #9 | 1 | 1 | 1 | 0 | 1 | 0 |
| Second operation γ | | | | | 0 | 1 |

Fig.9C
3 blocks used

| Block No. | Defective b3 | In use b2 | Deletion 1 b1 | Deletion 2 b0 | A side input value | B side input value |
|---|---|---|---|---|---|---|
| #0 | 1 | 0 | 1 | 0 | 0 | 0 |
| #1 | 1 | 0 | 1 | 0 | 0 | 0 |
| #2 | 1 | 0 | 1 | 0 | 0 | 0 |
| #3 | 1 | 0 | 1 | 0 | 0 | 0 |
| #4 | 1 | 0 | 1 | 0 | 0 | 0 |
| #5 | 1 | 0 | 1 | 0 | 0 | 0 |
| #6 | 1 | 1 | 1 | 0 | 1 | 0 |
| #7 | 1 | 1 | 1 | 0 | 1 | 0 |
| #8 | 1 | 1 | 1 | 0 | 1 | 0 |
| #9 | 1 | 1 | 1 | 0 | 1 | 0 |
| Second operation γ | | | | | 0 | 1 |

Fig.9D
2 to #4, 3 blocks deleted

| Block No. | Defective b3 | In use b2 | Deletion 1 b1 | Deletion 2 b0 | A side input value | B side input value |
|---|---|---|---|---|---|---|
| #0 | 1 | 0 | 1 | 0 | 0 | 0 |
| #1 | 1 | 0 | 1 | 0 | 0 | 0 |
| #2 | 1 | 1 | 0 | 1 | 0 | 1 |
| #3 | 1 | 1 | 0 | 1 | 0 | 1 |
| #4 | 1 | 1 | 0 | 1 | 0 | 1 |
| #5 | 1 | 0 | 1 | 0 | 0 | 0 |
| #6 | 1 | 1 | 1 | 0 | 1 | 0 |
| #7 | 1 | 1 | 1 | 0 | 1 | 0 |
| #8 | 1 | 1 | 1 | 0 | 1 | 0 |
| #9 | 1 | 1 | 1 | 0 | 1 | 0 |
| Second operation γ | | | | | 0 | 0 |

Fig.10A
4 blocks used

| Block No. | Defective b3 | In use b2 | Deletion 1 b1 | Deletion 2 b0 | A side input value | B side input value |
|---|---|---|---|---|---|---|
| #0 | 1 | 0 | 1 | 0 | 0 | 0 |
| #1 | 1 | 0 | 1 | 0 | 0 | 0 |
| #2 | 1 | 1 | 0 | 1 | 0 | 1 |
| #3 | 1 | 1 | 0 | 1 | 0 | 1 |
| #4 | 1 | 1 | 0 | 1 | 0 | 1 |
| #5 | 1 | 0 | 1 | 0 | 0 | 0 |
| #6 | 1 | 0 | 1 | 0 | 0 | 0 |
| #7 | 1 | 0 | 1 | 0 | 0 | 0 |
| #8 | 1 | 0 | 1 | 0 | 0 | 0 |
| #9 | 1 | 0 | 1 | 0 | 0 | 0 |
| Second operation γ | | | | | 1 | 0 |

End

Fig.10B
7 and #8, 2 blocks deleted

| Block No. | Defective b3 | In use b2 | Deletion 1 b1 | Deletion 2 b0 | A side input value | B side input value |
|---|---|---|---|---|---|---|
| #0 | 1 | 0 | 1 | 0 | 0 | 0 |
| #1 | 1 | 0 | 1 | 0 | 0 | 0 |
| #2 | 1 | 1 | 0 | 1 | 0 | 1 |
| #3 | 1 | 1 | 0 | 1 | 0 | 1 |
| #4 | 1 | 1 | 0 | 1 | 0 | 1 |
| #5 | 1 | 0 | 1 | 0 | 0 | 0 |
| #6 | 1 | 0 | 1 | 0 | 0 | 0 |
| #7 | 1 | 1 | 0 | 1 | 0 | 1 |
| #8 | 1 | 1 | 0 | 1 | 0 | 1 |
| #9 | 1 | 0 | 1 | 0 | 0 | 0 |
| Second operation γ | | | | | 1 | 0 |

Fig.10C
4 blocks used

| Block No. | Defective b3 | In use b2 | Deletion 1 b1 | Deletion 2 b0 | A side input value | B side input value |
|---|---|---|---|---|---|---|
| #0 | 1 | 0 | 1 | 0 | 0 | 0 |
| #1 | 1 | 0 | 1 | 0 | 0 | 0 |
| #2 | 1 | 0 | 0 | 1 | 0 | 0 |
| #3 | 1 | 0 | 0 | 1 | 0 | 0 |
| #4 | 1 | 0 | 0 | 1 | 0 | 0 |
| #5 | 1 | 0 | 1 | 0 | 0 | 0 |
| #6 | 1 | 0 | 1 | 0 | 0 | 0 |
| #7 | 1 | 0 | 0 | 1 | 0 | 0 |
| #8 | 1 | 1 | 0 | 1 | 0 | 1 |
| #9 | 1 | 0 | 1 | 0 | 0 | 0 |
| Second operation γ | | | | | 1 | 0 |

Fig.10D
2 and #3, 2 blocks deleted

| Block No. | Defective b3 | In use b2 | Deletion 1 b1 | Deletion 2 b0 | A side input value | B side input value |
|---|---|---|---|---|---|---|
| #0 | 1 | 0 | 1 | 0 | 0 | 0 |
| #1 | 1 | 0 | 1 | 0 | 0 | 0 |
| #2 | 1 | 1 | 1 | 0 | 1 | 0 |
| #3 | 1 | 1 | 1 | 0 | 1 | 0 |
| #4 | 1 | 0 | 0 | 1 | 0 | 0 |
| #5 | 1 | 0 | 0 | 0 | 0 | 0 |
| #6 | 1 | 0 | 0 | 0 | 0 | 0 |
| #7 | 1 | 0 | 0 | 1 | 0 | 0 |
| #8 | 1 | 1 | 0 | 1 | 0 | 1 |
| #9 | 1 | 0 | 0 | 0 | 0 | 0 |
| Second operation γ | | | | | 0 | 0 |

Fig.11A
1 block used

| Block No. | Defective b3 | In use b2 | Deletion 1 b1 | Deletion 2 b0 | A side input value | B side input value |
|---|---|---|---|---|---|---|
| #0 | 1 | 0 | 1 | 0 | 0 | 0 |
| #1 | 1 | 0 | 1 | 0 | 0 | 0 |
| #2 | 1 | 1 | 1 | 0 | 1 | 0 |
| #3 | 1 | 1 | 1 | 0 | 1 | 0 |
| #4 | 1 | 0 | 0 | 1 | 0 | 0 |
| #5 | 1 | 0 | 1 | 0 | 0 | 0 |
| #6 | 1 | 0 | 1 | 0 | 0 | 0 |
| #7 | 1 | 0 | 0 | 1 | 0 | 0 |
| #8 | 1 | 0 | 0 | 1 | 0 | 0 |
| #9 | 1 | 0 | 1 | 0 | 0 | 0 |
| Second operation γ | | | | | 0 | 1 |

← End

Fig.11B
1 block used

| Block No. | Defective b3 | In use b2 | Deletion 1 b1 | Deletion 2 b0 | A side input value | B side input value |
|---|---|---|---|---|---|---|
| #0 | 1 | 0 | 1 | 0 | 0 | 0 |
| #1 | 1 | 0 | 1 | 0 | 0 | 0 |
| #2 | 1 | 0 | 1 | 0 | 0 | 0 |
| #3 | 1 | 1 | 1 | 0 | 1 | 0 |
| #4 | 1 | 0 | 0 | 1 | 0 | 0 |
| #5 | 1 | 0 | 1 | 0 | 0 | 0 |
| #6 | 1 | 0 | 1 | 0 | 0 | 0 |
| #7 | 1 | 0 | 0 | 1 | 0 | 0 |
| #8 | 1 | 0 | 0 | 1 | 0 | 0 |
| #9 | 1 | 0 | 1 | 0 | 0 | 0 |
| Second operation γ | | | | | 0 | 1 |

Fig.11C
All blocks deleted

| Block No. | Defective b3 | In use b2 | Deletion 1 b1 | Deletion 2 b0 | A side input value | B side input value |
|---|---|---|---|---|---|---|
| #0 | 1 | 1 | 0 | 1 | 0 | 1 |
| #1 | 1 | 1 | 0 | 1 | 0 | 1 |
| #2 | 1 | 1 | 0 | 1 | 0 | 1 |
| #3 | 1 | 1 | 1 | 0 | 1 | 0 |
| #4 | 1 | 1 | 1 | 0 | 1 | 0 |
| #5 | 1 | 1 | 0 | 1 | 0 | 1 |
| #6 | 1 | 1 | 0 | 1 | 0 | 1 |
| #7 | 1 | 1 | 1 | 0 | 1 | 0 |
| #8 | 1 | 1 | 1 | 0 | 1 | 0 |
| #9 | 1 | 1 | 0 | 1 | 0 | 1 |
| Second operation γ | | | | | 0 | 0 |

Fig.11D
3 blocks deleted

| Block No. | Defective b3 | In use b2 | Deletion 1 b1 | Deletion 2 b0 | A side input value | B side input value |
|---|---|---|---|---|---|---|
| #0 | 1 | 1 | 0 | 1 | 0 | 1 |
| #1 | 1 | 1 | 0 | 1 | 0 | 1 |
| #2 | 1 | 1 | 0 | 1 | 0 | 1 |
| #3 | 1 | 0 | 1 | 0 | 0 | 0 |
| #4 | 1 | 0 | 1 | 0 | 0 | 0 |
| #5 | 1 | 1 | 0 | 1 | 0 | 1 |
| #6 | 1 | 1 | 0 | 1 | 0 | 1 |
| #7 | 1 | 0 | 1 | 0 | 0 | 0 |
| #8 | 1 | 1 | 0 | 1 | 0 | 0 |
| #9 | 1 | 1 | 0 | 1 | 0 | 1 |
| Second operation γ | | | | | 0 | 0 | ations # EXTERNAL STORAGE DEVICE

CLAIM OF PRIORITY

The present application claims priority from Japanese application P2004-4097 filed on Jan. 9, 2004, the content of which is hereby incorporated by reference into this application.

BACKGROUND OF THE INVENTION

1. Field of the Invention

The present invention relates to an external storage device that incorporates flash memory.

2. Description of the Related Art

From the past, there have been external storage devices that incorporate flash memory which is non-volatile semiconductor memory. With flash memory, data does not disappear even when the power is shut off, and it has features such as that it has a comparatively low price compared to EEPROM (Electrically Erasable Programmable ROM) which is another non-volatile memory. On the other hand, flash memory has structural limitations such as that data erasing is performed in block units, and that the number of block erases is limited. Specifically, by repeating erasing only of specific blocks, there is a marked decrease in life as memory. From this kind of flash memory feature, when using flash memory as an external storage device, a process of leveling the erase count for each block (in other words, the data rewrite count) is performed.

For example, in the No. WO99/21093-A, within the software, using an address conversion table (map) for linking the virtual address allocated as the storage area of specified data (also called the logical address) and the physical address of each block of the flash memory (also called the physical address), disclosed is a technology with which while attempting to level the block erase count, the physical block (physical address) of the flash memory corresponding to the virtual address for which data is written is specified.

However, with this kind of address conversion process, complex firmware software is required for converting the logical address and the physical address, and manufacturing of the firmware was complex and also took time for processing. Also, when this kind of process is executed using software, the processing by software increases, so in fact, significant time is used for processing.

SUMMARY

The present invention solves at least part of this kind of problem, and its purpose is to construct an external storage device that takes into consideration leveling of the erase count and that implements using hardware the selection of data writable blocks.

The first aspect of the external storage device of the present invention, to solve at least part of the aforementioned problems, comprises a flash memory having a plurality of blocks for storing data; a block management register and n operation gates provided at each of the blocks of the flash memory; n control circuits; block selection unit; and storage unit that stores data to the blocks of the flash memory. This block management register includes a use possibility register for indicating the use status of the block, and n (n is an integer of 2 or greater) erase count registers for indicating the erase count value of the block data. Also, the n operation gates respectively output result values that indicate erase count value of the usable blocks based on logical product of a value of use possibility register and each of the erase count register values, and the n control circuits classify the usable blocks into n groups according to the erase count value based on the outputted result values of the operation gates. Each of control circuits has a first circuit for outputting signals for indicating the usable block among the blocks included in one of the groups in a constitution sequence; and a second circuit for outputting signals for indicating that there are no usable blocks within the one group the block selection unit specifies one group among n groups in a cyclic sequence for each output timing of the second circuit of the control circuit and selects the usable block based on the output signal of the first circuit, and the storage unit stores the data in the selected block.

Also, the aspect of the method corresponding to the aspect of the external storage device of the present invention comprising the steps of storing information for indicating a use status of the block and an erase count of the block for each of the blocks; classifying the usable blocks into n (n is an integer of 2 or greater) groups according to the erase count based on the information; and selecting one group among groups in a cyclic, and for one group, writing the data in a block constitution sequence to the usable block belonging to the selected group, and after using the all usable blocks for writing, selecting another group in the specified sequence, and writing the data to the selected block.

According to the aspect of the external storage device and the method thereof of the present invention, based on the use status and the erase count information stored in each block constituting the flash memory, the plurality of blocks is classified into n groups according to the erase count. During data write, the usable (in other words, empty) blocks of one of the classified groups are used in the block constitution sequence. When all of the empty blocks of one group are used, the data is written to the usable blocks of another group selected in a specified sequence. Between the sequential n groups, the items in charge for selecting the block used for data write are alternated, and data is written to the selected block. Therefore, by the n groups classified according to the erase count being sequentially alternated, it is possible to level the block erase count as the overall flash memory. Also, the process of selecting the block used for external storage device data write is constituted using hardware circuits including registers or gates, so it is possible to increase the processing speed compared to processing using software.

For the external storage device having the constitution noted above, as long as n is an integer of 2 or greater, any number is acceptable, but it is also possible to constitute this so that when this n is 2, the erase count registers of the block management register consist of a first erase count register for indicating that the block erase count is 0 times or an even number of times, and a second erase count register for indicating that the block erase count is an odd number of times. Also the operation gates include a first gate for outputting the result of the logical product operation of the value of use possibility register and each of the first erase count register values, and a second gate for outputting the result of the logical product operation of the value of use possibility register and the second erase count register values. The two control circuits consist of a first control circuit for inputting the output result value of the first gate and for indicating the group for which the erase count of the usable block is 0 times or an even number of times, and a second control circuit for inputting the output result value of the second gate and for indicating the group for which the erase count of the usable block is an odd number of times.

The block selection unit alternates the group for selecting the usable block between groups indicated by the first control circuit and the second control circuit and outputs the usable block number based on the output timing of the second circuit.

According to this aspect of the external storage device, the usable blocks are classified into two groups, the groups for which the erase count is 0 times or an even number of times, and the odd numbered groups, and the item in charge for selecting the block used for writing is repeatedly alternated between both groups. Therefore, it is possible to easily construct a system using a few registers and gates.

For the external storage device having the constitution noted above, the block management register comprises a state register that outputs a value whether the block is defective or not, and the n operation gates perform the logical product operation of the value of the use possibility register, each of the erase count register values and the value of the state register. According to this external storage device, by adding the register for indicating whether the block is defective or not, it is possible to remove the defective blocks from the choices of blocks used for writing.

For the external storage device having the constitution noted above, the block management register comprises a logical address register for storing the logical address that is the address on the virtual memory space allocated as the storage area of the data. The external storage device further comprises for each block, a comparator for comparing a specified logical address and the address stored in the logical address register and outputting the result of the comparison, and a controller for storing the logical address in the logical address register corresponding to a one block at the timing of writing data to the block, and when the data written in the logical address is required to read, specifying the block in which the data is written and reading the data from the block based on the result output by the comparator.

According to this external storage device, at the write timing of data to one block, the logical address of that written data is stored in the logical address register. When reading data from the flash memory, the logical address for which reading is desired and the address stored in the logical address register of all the blocks being used are compared by each comparator at once. As a result of comparison, the desired data is output from the concerned block. Therefore, no matter which block within the flash memory the specified data is stored in, it is possible to execute reading of the desired data instantly by using each comparator.

The storage means of the external storage device having the constitution noted above may also be means that generate a table for representing the corresponding relationship between the logical address that is the address on the virtual memory space allocated as the storage area of the data and the physical address of the block selected by the block selection means and in which the data is stored, and that store the data based on this table. According to this external storage device, selection of the usable blocks is performed using hardware, and the table for representing the corresponding relationship is generated using software. By using this table, it is possible to easily select the physical address corresponding to the logical address, and to read the desired data.

The block management register of the external storage device having the constitution noted above may also be constituted using non-volatile memory. According to this external storage memory, the specified information for each block changed for each timing of access to the block is stored in the non-volatile memory. Therefore, even when the power supply is cut off, it is possible to always store the specified information for managing the blocks.

The external storage device having the constitution noted above comprises a storage unit for doing non-volatile storage at a specified timing of a specified value stored in the block management register, and when power is turned on to the external storage device, the specified value that the storage unit has may be transferred to the block management register. According to this external storage device, the specified value written to the non-volatile storage unit at the specified timing is stored even when supply of power to the system is cut off, and it is possible to transfer that specified value to the block management register when the power is turned on.

The storage unit of the external storage device having the constitution noted above may also be an area secured in advance in part of the flash memory according to this external storage device, part of the flash memory is used as the area for storing information stored in the block management register. Therefore, it is not necessary to newly provide non-volatile memory.

The flash memory of the external storage device having the constitution noted above may also be NAND type structure flash memory.

BRIEF DESCRIPTION OF THE DRAWINGS

FIG. 9A to FIG. 9D are explanatory drawings for describing an example of the operation of the write block using leveling processing.

FIG. 10A to FIG. 10D are explanatory drawings for describing an example of the write block calculation using leveling processing.

FIG. 11A to FIG. 11D are explanatory drawings for describing an example of the write block calculation using leveling processing.

DESCRIPTION OF THE PREFERRED EMBODIMENTS

Following, aspects of implementing the present invention are described based on embodiments in the following order.
A. Schematic Structure of External Storage Device:
B. Write Block Leveling Process:

(B-1) First Operation Circuit:
(B-2) Second Operation Circuit:
(B-3) Block Identification Circuit:
(B-4) Example of Leveling Circuit:
C. Data Access Processing:
D. Variation Examples:

A. SCHEMATIC STRUCTURE OF EXTERNAL STORAGE DEVICE

Figure 1:
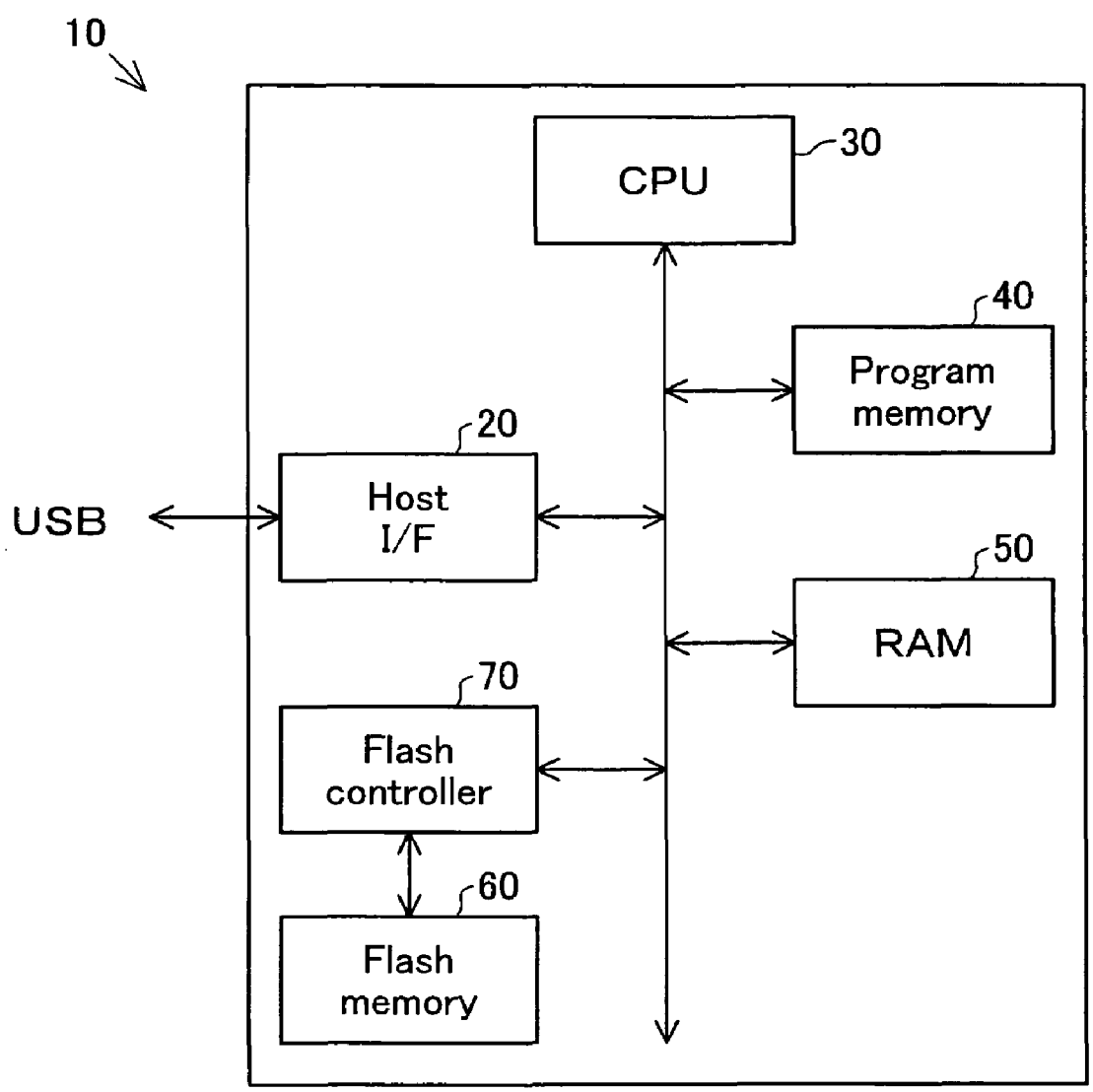
FIG. 1 is an overall block diagram showing the constitution of the external storage device as the first embodiment of the present invention.

FIG. 1 is an overall block diagram showing the constitution of the external storage device 10 as the first embodiment of the present invention. As shown in the drawing, this external storage device 10 comprises a host interface 210 for exchange data with external devices, a CPU 30, a program memory 40, a RAM 50, a flash memory 60 for doing non-volatile storage of data from outside, a flash controller 70 for controlling reading of data to the flash memory 60, and the like.

The host interface 20 complies with the Universal Serial Bus (USB) standard, so connection with external devices (e.g. a personal computer, a digital still camera, or the like) is possible. Access such as writing or reading of data from the external device to the external storage device 10 is performed via this host interface 20. Note that the host interface 20 may also comply with a standard other than USB such as IEEE 1394 or ATA.

The CPU 30 reads the execution program from the program memory 40 when the power is turned on, and prepares an operating environment for the overall external storage device 10. When the CPU 30 receives a data rewrite request from the external device via the host interface 20, for example, before the actual writing to the flash memory 60, it temporarily reads the data within the flash memory 60 and performs data correction with the RAM 50 as the work area. This is because data erase of the flash memory 60 is performed in block units. Then, after the data correction is performed, data is written to the flash memory 60. In specific terms, the CPU 30 outputs to the flash controller 50 instructions for reading of data within the flash memory 60, instructions to write the correction data, and the like.

The flash controller 70 performs management and control of data within the flash memory 60 such as reading of data from the flash memory 60, writing of data, and erasing of data, according to the CPU 30 instructions. In specific terms, to avoid frequent data rewrites to a specific area that reduce the life of the flash memory 60, the area for which data write is possible is calculated, and control used for averaging the data write area of the flash memory 60 (called leveling processing) is implemented using hardware. This leveling processing will be described later.

Figure 2:
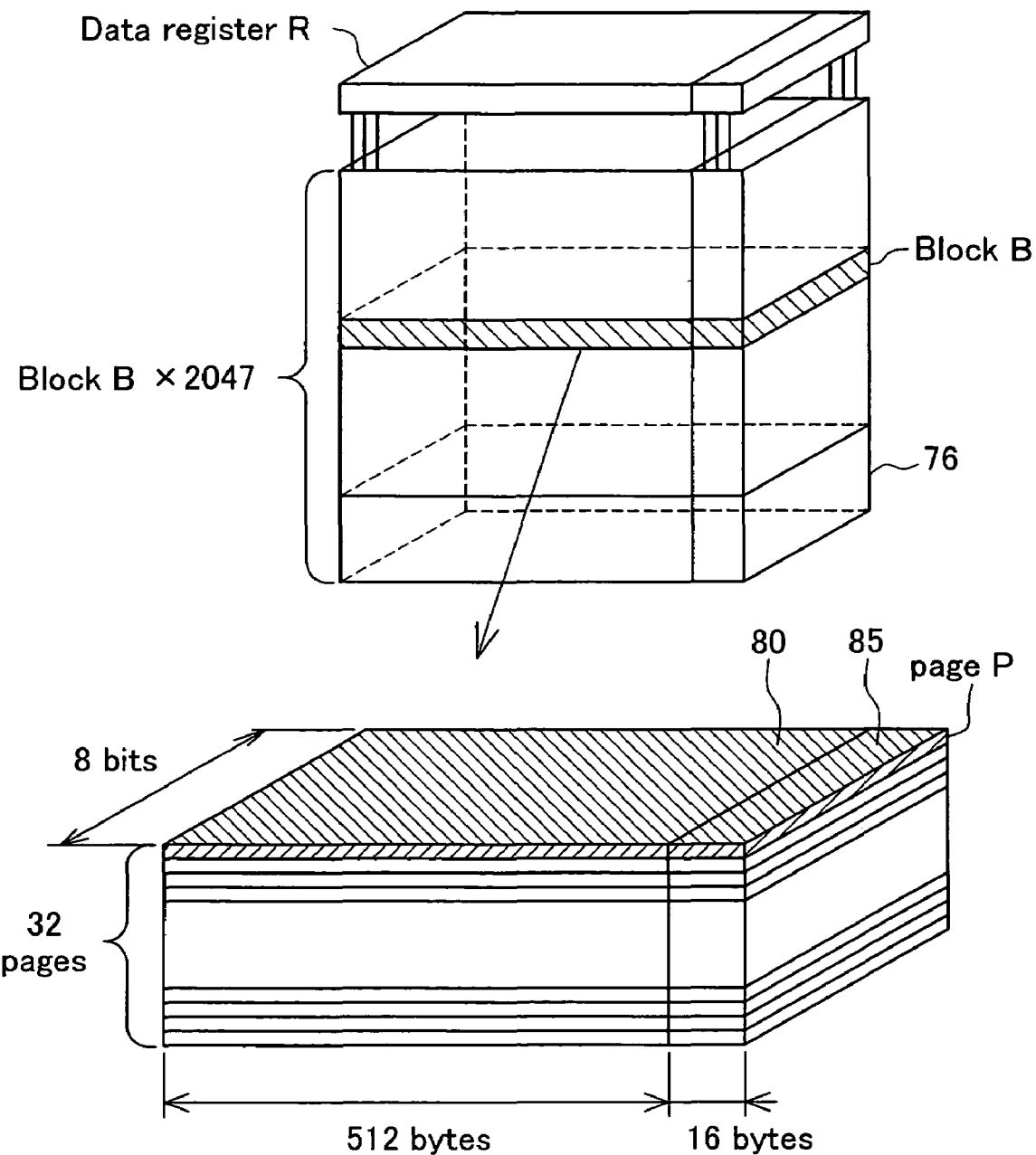
FIG. 2 shows the structure of the flash memory used with this embodiment.

The flash memory 60 comprises a plurality of blocks that are data write areas, and this is memory for storing data in each block. FIG. 2 shows the structure of the flash memory 60 used with this embodiment. With this embodiment, a NAND type flash memory which has 256 Mbits of capacity is used. As shown in the drawing, this flash memory 60 comprises a data register R for receiving a command from the flash controller 70 and temporarily storing data, and 2047 physical blocks B that are data storage areas. One of these blocks B is divided into areas of 32 pages P.

This flash memory 60 can perform data erase in block units, and read and write data in page units. One page, which is the minimum unit for reading and writing, comprises a 512 byte data write area 80 and a 16 byte redundant part area 85 for storing the error correcting code (ECC code) or the like. This ECC (error correcting code) code is generated in page units for the data written to the block using the ECC circuit within the flash controller 70. In other words, the flash controller 70 adds the ECC code to the data at the data write stage and stores it in the flash memory 60. The ECC code stored in the redundant part area 85 is used for judging whether or not there is an error in the read data when a data read command is received from the CPU 30. When an error is determined and this is an error within a specified scope, the ECC circuit within the flash controller 70 performs error correction based on the ECC code. Note that this kind of correction using the ECC code may also be executed by the CPU 30.

When an instruction to write a certain file data is sent from the personal computer that is the external device, for example, to the external storage device 10 constituted in this way, the CPU 30 which received data via the host interface 20 handles that file data in 16 Kbyte block units, and outputs a block unit write command to the flash controller 70. The flash controller 70 which receives the command selects the block to be used for writing. Then, the data temporarily stored in the data register R is instantly written to the selected block to be used for writing. This write unit is a page unit as described above. The flash controller 70 reads 16 Kbytes of data in sequential page units and writes to the data register R. In this way, the flash controller 70 writes sequential data to a specified block page. When the written file data has a capacity exceeding 16 Kbytes, the next block to be used for writing is selected and data is written. Note that the file data is handled in 16 Kbyte units, and fractional data is also written to the next block, so there will be unused pages in one block. The management information of each block is used for the selection of the block used for writing in this way.

With this embodiment, the block management register which is the area for storing the management information of each block is provided in the flash controller 70. The block management register comprises a management information register consisting of three types of register and a logical address register. The management information register comprises a register for storing the value indicating whether or not a block is defective, a register for storing the value indicating whether or not the block is in use, and a register for storing the value for determining the erase history of the block. The logical address register is the register for storing the logical address which is the virtually allocated storage area address.

Within each value stored in this block management register, the management information register value is used for the block selection operation that is used for writing by the leveling process with the flash controller 70, and the logical address register value is used during reading of the desired data or during reading that accompanies data rewrite. In other words, the flash controller 70 comprises the "block management register" of the patent claims, and also comprises functions as the "operation gate," "control circuit," and "block selection means."

With this embodiment, within the plurality of blocks of the flash memory 60, three blocks are used as the storage area 76 for doing non-volatile storage of the values stored in the block management register. The values stored in the block management register are stored in the storage area 76 of the flash memory 60 at a specified timing such as when the power is cut off or at fixed intervals or the like, and when the external storage device 10 power is turned on, these are transferred from the storage area 76 to the block management register. Note that it is also possible to separately provide within the external storage device 10 a non-volatile memory for storing values stored in the block management register, and to constitute this independently from the flash memory 60. It is also possible to substitute the block management register with the RAM 50 storage area, and to provide non-volatile memory subordinate to the flash controller 70. In this case, at a specified timing such as when the power is cut off or at specified intervals or the like, the management information and logical addresses used for operations by the flash controller 70 is stored in the memory subordinate to the flash controller 70, and by having each value transferred from the memory to the RAM 50 (in other words, the block management address) when the power is turned on to the external storage device 10, it is possible to constitute the external storage device 10.

B. WRITE BLOCK LEVELING PROCESS

Figure 3:
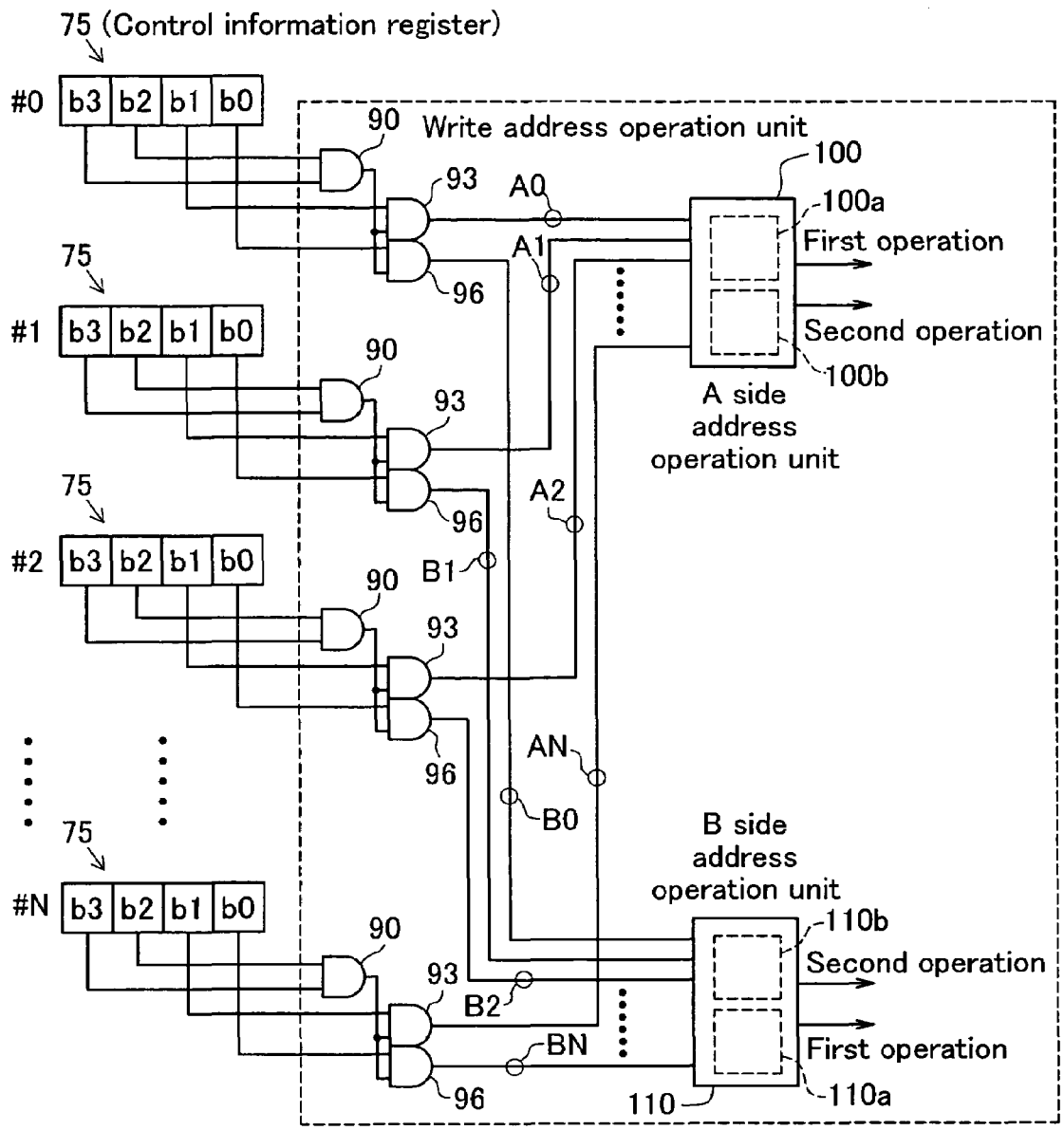
FIG. 3 is an explanatory drawing for describing the calculation process of the writing block of this embodiment.

FIG. 3 is an explanatory drawing for describing the write block operation process of this embodiment. The #0 to #N shown in the drawing indicate the physical number (hereafter called the block number) of the block of the flash memory 60. As shown in the drawing, the block management register 75 comprises four registers b3 to b0 as management information registers provided at a number corresponding each block.

Here, the register b3 corresponds to the "good/bad register" of the patent claims that is the register for storing the value indicating whether a block is defective or not, the register b2 corresponds to the "use possibility register" of the patent claims that is the register for storing the value indicating the block use status, and the registers b1 and b0 correspond to the "erase count register" of the patent claims that is the register for storing the value indicating the block erase history. Note that the block management register 75 comprises the logical address register as described above, but because there is no direct relationship to the description of the write block operation using leveling processing, this is omitted in FIG. 3.

If the block is normal, the value 1 is written to the register b3 (hereafter called the good/bad register b3), and if it is defective, the value 0 is written. The flash memory 60 comprises a plurality of blocks, and each block is used as the data storage area as described previously, but from the time of shipping, there are blocks which cannot be used from the start. In light of this, generally, at the external storage device manufacturing stage, good/bad testing is done for all blocks, and processing so as not to write data thereafter is performed on blocks determined to be defective. With this embodiment, for blocks determined to be defective at the time of shipping, at the manufacturing stage of the external storage device 10, and for blocks that have bit errors that cannot be handled with error correction using EEC codes, when it is determined to be a block that the CPU 30 cannot use, during a data read described later, the value 0 is written to the good/bad register b3 corresponding to that block.

If the block is not in use, the value 1 is written to the register b2 (hereafter called the use possibility register b2), and if it is in use, the value 0 is written. This value is rewritten during writing of data stored in the block and during erasing of data written in the block by the flash controller 70. The circuit that writes the value to this use possibility register b2 can be constituted by AND gates for outputting logical products. For example, the write signals from the flash controller 70 and the signal Bj of the block signal specified by the process described later are input to the AND gate and the AND gate output value is written to the use possibility register b2. By doing this, one block to be accessed is specified, and also the value 1 or the value 0 is written to the use possibility register b2.

The registers b1 and b0 (hereafter called erase count registers b1 and b0), by the two registers alternately repeating the value 1 and the value 0, indicate the block erase history. In specific terms, in the initial state, in other words, in the unused state of one block, (1, 0) are written to the erase count registers (b1, b0), the data within one block (in other words, all page data) becomes unnecessary, and in the case of erasing, during the first erase, (0, 1) is written, during the second erase (1, 0) is written, during the third erase, (0, 1) is written, and during the fourth erase, (1, 0) is written, with this continuing on in repeatedly in sequence. Specifically, when the erase count register b1 is the value 1, this indicates that the erase count of one block is 0 times or an even number of times, and when the erase count register b0 is the value 1, this indicates that the erase count of one block is an odd number of times.

Figure 4:
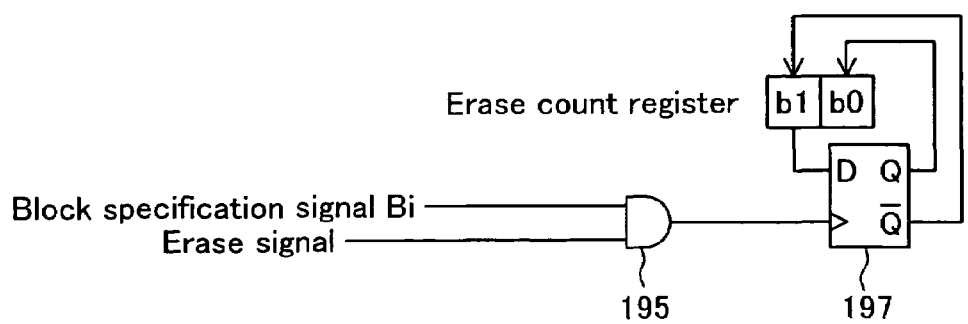
FIG. 4 is a circuit diagram showing an example of an erase count register write circuit.

This circuit for writing values to the erase count registers b1 and b0 may be constituted by AND gates and a D type flip-flop circuit for functioning as an erase count counter. An example of the circuit diagram of this erase count register write circuit is shown in FIG. 4. FIG. 4 shows the write circuit of the erase count registers b1 and b0 of one block, and in fact, the number of circuits to match the number of blocks is required. As shown in the drawing, the AND gate 195 inputs the erase signals from the flash controller 70 and specified block number signals B1. The D type flip-flop circuit 197 inputs the erase count register b1, and with the output value of the AND gate 195 as the clock pulse, writes the input value to the erase count register b0, and writes the value that is the inversion of the input value to the erase count register b1. By working in this way, at each erase timing, an alternately inverted value is written to the erase count register b1 and the erase count register b0.

The flash controller 70 executes the operation for selecting the writing block based on the management information register 75 of each block. As shown in FIG. 3, this operation circuit comprises a first AND gate 90, a second AND gate 93, a third AND gate 96, an A side address operation unit 100, and a B side address operation unit 110, and the block for writing final data from the blocks selected by the operation circuit is finally specified. Note that the circuit for finally specifying the block is described later.

The first AND gate 90 inputs the value written to the good/bad register b3 and the use possibility register b2, and the logical product of this is output to the second AND gate 93 and the first AND gate 90. The second AND gate 93 inputs the first AND gate 90 output value and the erase count register b1 value, and the signals A0 to AN that are the logical product are output to the A side address operating unit 100. Also, the third AND gate 96 inputs the first AND gate 90 output value and the erase count register b0 value, and the signals B0 to BN that are the logical product of this are output to the B side address operation unit 110.

As noted above, the A side address operation unit 100 and the B side address operation unit 110 input signals corresponding to the number of blocks #0 to #N. Of the values (value 1 or value 0) input to the A side address operation unit 100, blocks indicating the value 1 have an erase count of 0 times or an even number of times, and indicate that this is a block that can be used (in other words, that it is an unused or already erased open area). On the other hand, of the values (value 1 or value 0) input to the B side address operation unit 110, blocks indicating the value 1 have an erase count that is an odd number of times, and indicates that this is a usable (in other words, an already erased empty area) block. To say this another way, blocks for which the erase counts is 0 times or an even number of times are identified by the A side address operation unit 100, and blocks for which the erase count is an odd number of times are identified by the B side address operation unit. The overall usable blocks are roughly divided by whether the erase count is even numbered or odd numbered.

This A side address operation unit 100 and the B side address operation unit 110 execute two operations. The first operation is the operation of specifying the item with the smallest block number among the usable blocks (blocks for which the input value is value 1) from the input values (value 0 or value 1) of all the blocks with block numbers #0 to #N. The second operation is the operation of outputting the value 1 when all of the input values (value 0 or value 1) of all the blocks of block numbers #0 to #N are value 0.

Figures 5, 6:
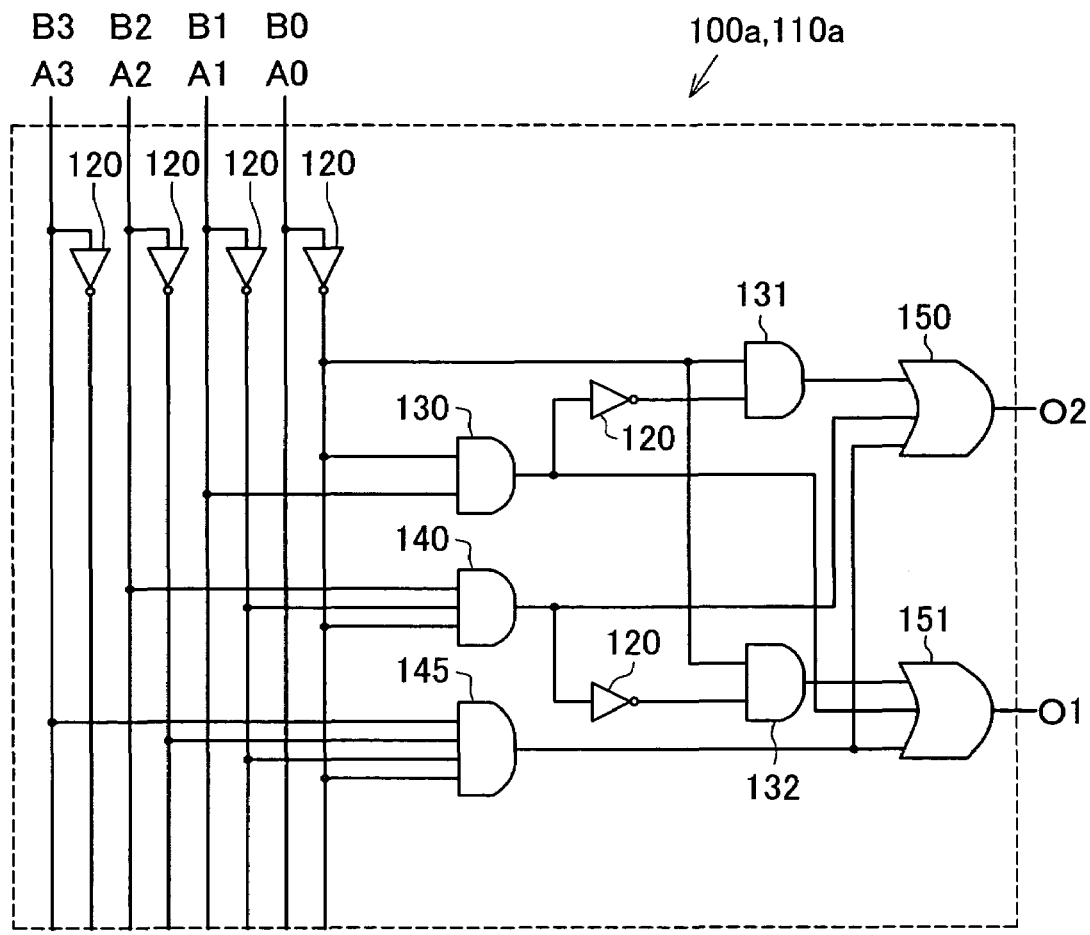
FIG. 5 is a circuit diagram showing part of the circuit for executing the first operation.
FIG. 6 is a truth table showing the relationship between the input value and the block number for the first operation circuit.

(B-1) First Operation Circuit:

FIG. 6 is a circuit diagram showing part of the circuits for executing the first operation (hereafter called the first operation circuits 100*a* and 110*a*). The A side address operation part 100 comprises the first operation circuit 100*a*, and the B side address operation part 110 comprises the first operation circuit 110*a*, and only the input value is different, with the circuit configuration being the same. Therefore, hereafter, the first operation 100*a* of the A side address operation unit 100 of the input values A0 to AN will be described. Note that to make the description simple here, the values input to the A side address operation unit 100 are the input values A0 to A3 of four blocks (#0 to #3).

As shown in the drawing, this circuit comprises an INV gate 120 for inverting the input logic, AND gates 130, 131, and 132 for performing logical product operations, AND gates 140 and 45 that have multi-inputs, and multi-input OR gates 150 and 151 for performing logical sum operations.

The signal line of the input values A0 to A3 comprise that signal line itself and the signal line inverted via the INV gate 120. Following, the signals themselves are noted as signals A0 to A3, and the inverted signals are noted as A0\ to A3\ with "\" added. The AND gate 130 inputs the signal A0\, and the signal A1, the AND gate 140 inputs the signal A0\, the signal A1\, and the signal A2, the AND gate 145 inputs the signal A0\, the signal A1\, the signal A2\, and the signal A3, and the logical product operation is performed for these.

The AND gate 131 inputs the signal A0\ and the inverted signal of the output value of the AND gate 130, the AND gate 132 inputs the signal A0\ and the inverted signal of the output value of the AND gate 140, and the logical product operation is performed for these. The OR gate 150 inputs the output values of the AND gates 131, 140, and 145, the OR gate 151 inputs the output values of the AND gates 132, 130, and 145, and the logical sum operation for these is performed. The output value O1 is output from the OR gate 151, and the output value O2 is output from the OR gate 150. Note that the output values O1 and O2 are values with encoded block numbers (encoded), and when (O1, O2) are (0, 0), the block number #0 is indicated, when (0, 1), the block number #1 is indicated, when (1, 0), the block number #2 is indicated, and when (1, 1), the block number #3 is indicated.

For example, when the input signal #0 is value 1, the value 0 inverted via the INV gate 120 is input to all the AND gates 130, 140, and 145, so what is finally output from the two OR gates 150 is the value 0. In other words, the block indicating the value 1 initially in the block constitution sequence of block number #0, #1, #2, and #3 becomes the block number #0 for which the code is (0, 0).

FIG. 6 shows the truth table indicating the relationship between the input values of the signals A0 to A3 (or B0 to B3) for this circuit and the block numbers (codes). As shown in the drawing, with this circuit, if the signal A0 is the value 1, (0, 0) is output, if the signal A0 is the value 0 and the signal A1 is the value 1, (0, 1) is output, if the signals A0 and A1 are the value 0 and the signal A2 is the value 1, (1, 0) is output, and if the signals A0, A1, and A2 are the value 0 and the signal A3 is the value 1, (1, 1) is output. By expanding this circuit according to the block count, it is possible to select the block for writing. Note that this circuit is one example, and it is also possible to constitute the same kind of circuit using another gate combination. It is also possible to provide a ROM on the external storage device 10, to use the conversion table according to the ROM, and to specify blocks. In this case, the conversion table may also be constituted to have the input values of the signals A0 to AN be addresses, and to store the output values corresponding to that.

Figure 7:
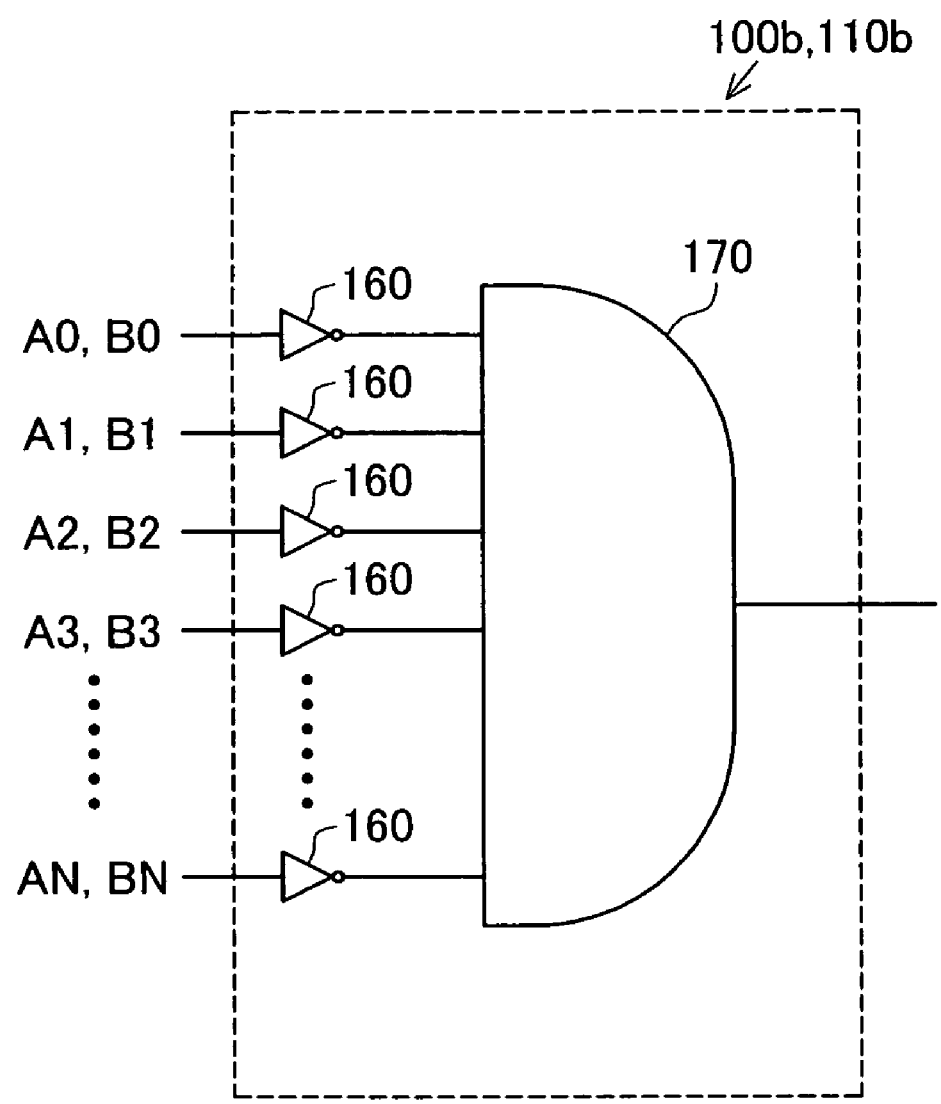
FIG. 7 is a circuit diagram showing the circuit for executing the second operation.

(B-2) Second Operation Circuit:

FIG. 7 is a circuit diagram of the circuits for executing the second operation (hereafter, called the second operation circuits 100*b* and 110*b*). The A side address operation unit 100 comprises the second operation 100*b* and the B side address operation unit 110 comprises the second operation 110*b*, but the same as with the first operation circuit, only the input values are different, and the circuit constitution is the same.

As shown in the drawing, this circuit comprises the INV gate 160 and the multi-input AND gate 170, and when all of the input values of the signals A0 to AN (or B0 to BN) are the value 0, the value 1 is output. Of course, this circuit may also have another constitution such as using a multi-input NOR gate. The value 1 output with these second operation circuits 100*b* and 110*b* means that the blocks used for writing within one group were used once through (in other words, the end signal). In specific terms, when the value 1 is output from the second operation circuit 100*b*, this means that within the group of blocks for which the erase count is 0 times or an even number of times (blocks classified by the A side address operation unit 100), the empty blocks that can be used for writing are gone, and when the value 1 is output from the second operation circuit 110*b*, this means that within the group of blocks for which the erase count is an odd number of times (the group classified by the B side address operation unit 110), the empty blocks that can be used for writing are gone.

Figure 8:
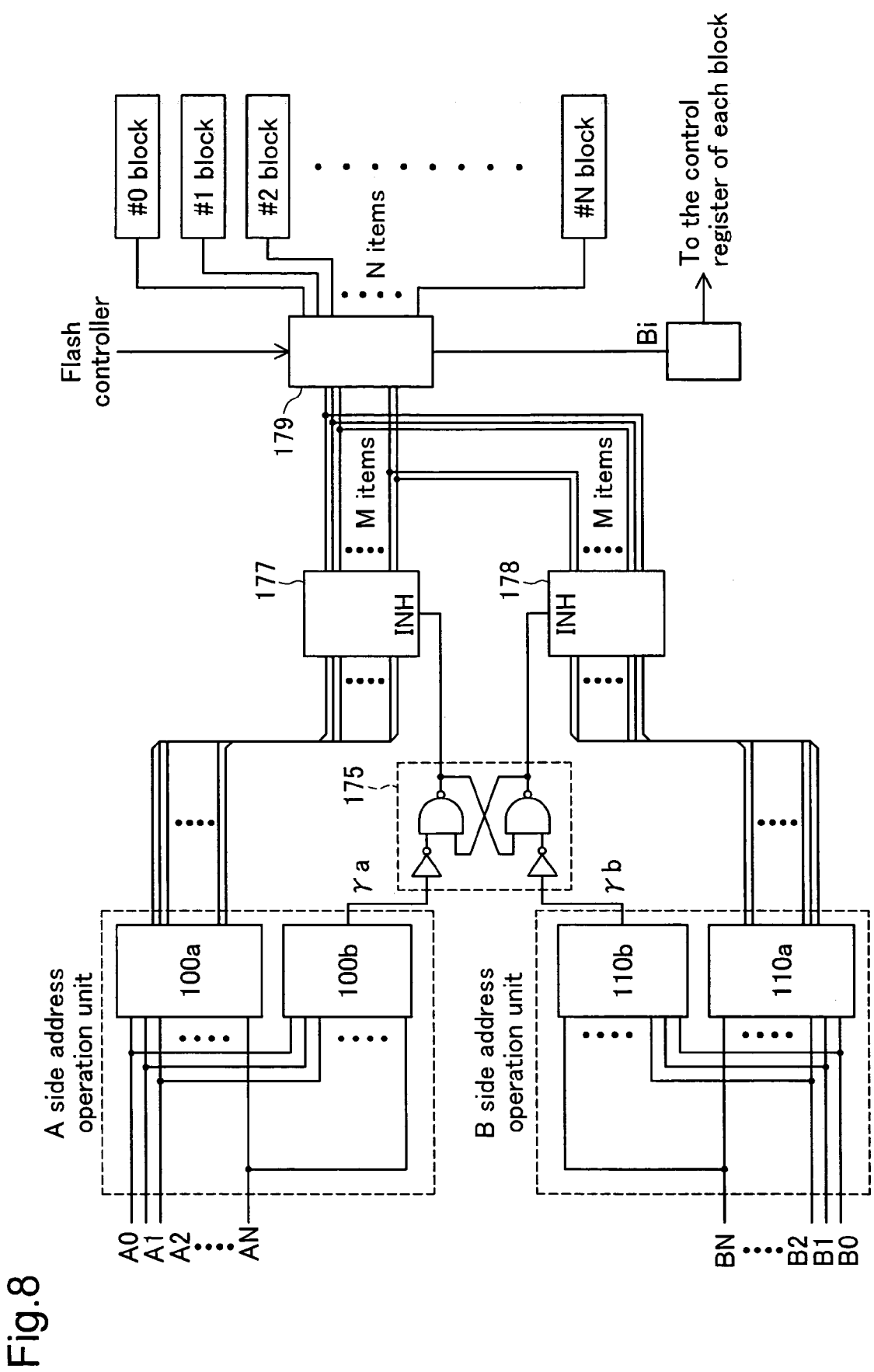
FIG. 8 is a circuit diagram of a circuit for specifying the block used for writing based on the first and second operation results.

(B-3) Block Identification Circuit:

FIG. 8 is a circuit diagram of the circuit for finally specifying the block used for writing based on the four operation results described above. As shown in the drawing, this circuit comprises an RS flip-flop circuit 175 for inputting the values from the A side second operation circuit 100*b* and the B side second operation circuit 110*b*, a bus buffer 177 for inputting the values from the A side first operation circuit 100*a*, a bus buffer 178 for inputting the values from the B side first operation circuit 110*a*, a decoder 179 for decoding the encoded data, and the like.

The RS flip-flop circuit 175 is a known circuit that inputs the value γa from the A side second operation circuit 100*b* and the value γb from the B side second operation circuit 110*b*, and that switches the output according to changes in the input values γa and γb. The RS flip-flop circuit 176 does exclusive output of output inhibit signals to one bus buffer 177 based on the input values γa and γb.

The bus buffer 177 connected to the output side of the A side first operation circuit 100*a* inputs the block number that is the encoded data, and when the signal from the RS flip-flop circuit 175 is an inhibit signal, the output of data from the first operation circuit 100a is inhibited. The same is also true for the bus buffer 178 connected to the output side of the B side first operation circuit 110a. The signal lines from the two bus buffers 177 and 178 have a wired connection, and the signals from the one bus buffer for which output is not inhibited via the RS flip-flop circuit 175 are input to the decoder 179.

The decoder 179 decodes the M encoded signals (the M in the case of the M power of the block count N=2) to N signals, and is a known circuit for specifying one block. The decoder 179 outputs an enable signal to the block used for writing as a signal for enabling output of write command signals from the flash controller 70 and writing of specified data is executed via the data bus to that block. Note that the block number signal Bi specified here is used for writing of the block management register.

For a circuit with this kind of constitution, from the A side group block for which the erase count is 0 times or an even number of times classified by the operation circuit shown in FIG. 3, the one block number (encoded data) selected by the first operation circuit 100a is output to the bus buffer 177. Similarly, from the B side group for which the erase count is an odd number of times, the one block number (encoded data) selected by the first operation circuit 110a is output to the bus buffer 178.

In this state, when the value γa of the A side second operation circuit 100b is switched from the value 0 to the value 1, for example, the inhibit signal is output to the bus buffer 177, and output from the bus buffer 177 is inhibited. This is because the even number time writing has ended. As a result, the block number of the B side group output from the bus buffer 178 is finally specified as the block for which write is possible. On the other hand, when the value γb of the B side second operation circuit 110b is switched from the value 0 to the value 1, similarly, when the odd number time writing has ended, output from the bus buffer 178 is inhibited, and the block number of the A side group output from the bus buffer 177 is finally specified as the block for which writing is possible.

As described above, for each group of the 0 time or even number time A group and the odd number time B side group classified according to the erase count, when data is written to the block used for writing within one group, and use of the blocks that can be used for writing has been done once through and ended, data is written to the blocks used for writing within the other group. For example, when updating specified data, the updated data is written to another block other than the block that data is stored in, and there is no performing of rewriting of update data to the same block. In this way, by alternately using the two groups of the group for which the erase count is an even number of times and the group for which it is an odd number of times, without using a specific block, it is possible to realize with hardware use of a block for which the overall erase count has been leveled.

(B-4) Example of Leveling Circuit:

To give a more specific description of the contents of this logical circuit, FIG. 9A to FIG. 9D, FIG. 10A to FIG. 10D, and FIG. 11A to FIG. 11D are explanatory drawings for describing examples of the operation of write blocks using leveling processing. FIG. 9A to FIG. 11D are tables showing the values written to the block management register of each block, the input values to the A side address operation unit 100 and the B side address operation unit 110 (hereafter called the A side input value and the B side input value), the A side second operation circuit 100b operation results γa, and the B side second operation circuit 110b operation results γb. Note that to make the description simple here, the block count is 10 (#0 to #9).

FIG. 9A shows the initial state when there are no defective blocks. In other words, because the block is normal, the value 1 is input to the good/bad register b3, because the initial state is unused, the value 1 is input to the use possibility register b2, and because of course the erase count is also zero, (1, 0) is input to the erase count registers (b1, b0). Each of the blocks have a value of 1 for the A side input values based on the value of this block management register, and for the operation results γa of the A side second operation circuit 100b, since all the blocks are not the value 0, the result is the value 0. On the other hand, each block for the B side input values are the value 0, and for the operation results γb of the B side second operation circuit 110b, since all the block have the value 0, the result is the value 1. Specifically, the block to be used for writing is selected based on the first operation results of the A side address operation unit 100 for which the second operation results γ are the value 0. Note that the block selection process with the first operation circuit for which the hardware constitution is shown in FIG. 5 is an equivalent process to, in the tables shown in FIG. 9 to FIG. 11, searching for the A side input value or the B side input value in sequence from the block number #0, and selecting the block that initially shows the value 1. Therefore, hereafter, selection of the block used for writing will be selection of the block that initially shows the value 1 from the table.

FIG. 9B shows the status of three blocks being used for writing of specified data. The diagonal line part in the drawing indicates that the value of the block management register 75 has been updated. In other words, from the A side input values of FIG. 9A, the blocks used for writing are the three blocks #0, #1, and #2, and to indicate that these are in use, the value 0 is input to the use possibility register b2. As a result, the A side input value corresponding to the three blocks is the value 0.

Note that with each update, the block management register 75 is sequentially added to part of the block pages, and after executing write until the end of the three blocks of the flash memory allocated as the use area of the block management register 75, erasing of the written block (e.g. the first one block written sequentially) is performed, and data is written to erased blocks again. Therefore, having the erase count of the blocks allocated as the storage area 76 for the values stored in the block management register 75 become a problem as the life of the flash memory 60 almost never occurs. Note that to increase the reliability relating to the storage of the value stored in the block management register 75, it is also possible to double the capacity of the storage area 76, and to store two types of stored values (in other words, to have a copy). It is also possible to use the Reed Solomon code to have a 2-bit or greater revision function.

FIG. 9C shows the state of use of a further three blocks. From the A side input value of FIG. 9B, the next block used for write (A side input value searched for in sequence from #0, block initially indicating the value 1) is the #3 block. Therefore, data is written to the three blocks #3, #4, and #5, and the value 0 is input to the use possibility register b2 that is in use. The A side input value corresponding to the three blocks being the value 0 is the same as in FIG. 9B.

FIG. 9D shows the state of erasing of the data of the three blocks #2, #3, and #4. When a data erase command is received via the CPU 30 from the external device, the flash controller 70 selects the block in which that data is stored, but for this operation, this will be described later as the data read operation, and here, this will be described as the erasing of the three blocks #2 to #4 being determined.

As shown in the drawing, the data of the three blocks #2 to #4 is erased, and because they are unused, the value 1 is input to the use possibility register b2, and (0, 1) is input to the erase count registers (b1, b0). As a result, the B side input value corresponding to the three blocks is the value 1, and the operation result γb of the B side second operation circuit 110b is the value 0, but because the operation result γa of the A side second operation circuit 100b still stays as the value 0, selection of the block used for writing continues to be based on the first operation results of the A side address operation unit 100. In other words, with the RS flip-flop circuit 176 shown in FIG. 8, even if the input value changes from the value 1 to the value 0, there is no change in the output value (inhibit signal switch), and at this stage, the block number from the bus buffer 177 is output to the decoder 179.

FIG. 10A shows the state of a further four blocks being used. The same as with FIG. 9B and C, data is written to the blocks #6, #7, #8, and #9 that can be used for writing based on the first operation results of the A side address operation unit 100. In this state, all of the A side input values are the value 0, and the operation results γa of the A side second operation circuit 100b change to the value 1. With output of this value 1, the selection of blocks that can be used for writing according to the first operation results of the A side address operation unit 100 ends, and thereafter, this is according to the first operation results of the B side address operation unit 110. At this stage, the RS flip-flop circuit 175 switches the inhibit signal output destination, and the block number from the bus buffer 178 is output to the decoder 179.

FIG. 10B shows the state of erasing of the data of the two blocks #7 and #8. As shown in the drawing, the unused blocks are the five blocks #2, #3, #4, #7, and #8.

FIG. 10C shows the state of four blocks being used. As shown in FIG. 10B, there are five blocks that are empty by erasure at this stage, and the blocks that can be used for writing (searching the B side input values in sequence from #0, the block that initially shows the value 1) are selected based on the first operation results of the B side address operation unit 110. In this case, the block that initially shows the value 1 is #2, and following that, blocks selected in the sequence of #3, #4, and #7 are used for writing.

FIG. 10D shows the state of erasing of data of the two block #2 and #3. As shown in the drawing, (1, 0) are input to the erase count registers (b1, b0) of the blocks #2 and #3. The #2 and #3 blocks are erased once at the stage of FIG. 9D, so this is the second erasure. Note that the A side input value corresponding to the block is the value 1, and the operation result γa of the A side second operation circuit 100b is the value 0, but since the operation result γb of the B side second operation circuit 110b stays the same as the value 0, the selection of blocks that can be used for writing continues to be based on the first operation results of the B side address operation unit 110. At the stage in FIG. 10D, the unused blocks are the three blocks #2, #3, and #8.

FIG. 11A shows the state of one block being used. When the block initially showing the value 1 is searched for from the B side input values shown in FIG. 10D, the #8 block is selected, and data is written to the #8 block. As shown in FIG. 11a, the B side input value corresponding to the #8 block is the value 0, and the B side input values of all the blocks are the value 0. Therefore, the operation result γb of the B side second operation circuit 110b is the value 1, and the writing once through to the already erased blocks for which the erase count is the first time ends.

FIG. 11B shows the state of a further one block being used. At the stage in FIG. 11A, selection of the blocks that can be used for writing based on the first operation result of the B side address operation unit 110 ends, so block selection is performed based on the first operation results of the A side address operation unit 100. In this case, the #2 block that initially shows the value 1 from the A side input values is selected, and data is written.

FIG. 11C shows the state of all data being erased. As shown in the drawing, all blocks that are in use (#0 to #2, #4 to #9) are erased, so the operation result γb of the B side second operation circuit 110b becomes the value 0, but since the operation results γa of the A side second operation circuit 100b stays the same at the value 0, the blocks that can be used for writing thereafter are selected based on the first operation results of the A side address operation unit 100.

FIG. 11D shows the state of three blocks being used. As described previously, the three blocks #3, #4, and #7 are selected according to the first operation results of the A side address operation unit 100 shown in FIG. 11C, and data is written there.

As shown above in the example of selection of blocks that can be used for writing, with this embodiment, after writing is performed once through across all the blocks in sequence from the #0 block, the next block for writing is selected in the sequence of the construction of blocks among the already erased blocks for which the erasing is an odd numbered time. Then, when all of the already erased odd numbered time blocks are used, the already erased even numbered time blocks are used. This kind of selection process of the usable blocks is performed using hardware with the circuits shown in FIG. 3, FIG. 5, FIG. 7, and FIG. 8, so compared to when processing using software, this is a simple constitution, and it is possible to increase the processing speed. Note that with this embodiment, by classifying into two groups, leveling of the erase count is implemented, but it is possible to execute more detailed leveling processing by further classifying into a plurality of groups and replacing in circulation the group for selecting the blocks that can be used for writing.

C. DATA ACCESS PROCESSING

With the external storage device 10 of this embodiment, during data updating, the data subject to updating in block units is read, corrected, and the updated data is written to unused (empty) blocks or erased blocks of the flash memory 60. After that, a method is used whereby blocks for which the original data exists are erased. Therefore, for writing of updated data, the same processing is done as the operation for the block selection described above, and for reading of data that is subject to updating, processing is done based on the data read operation described below.

Figure 12:
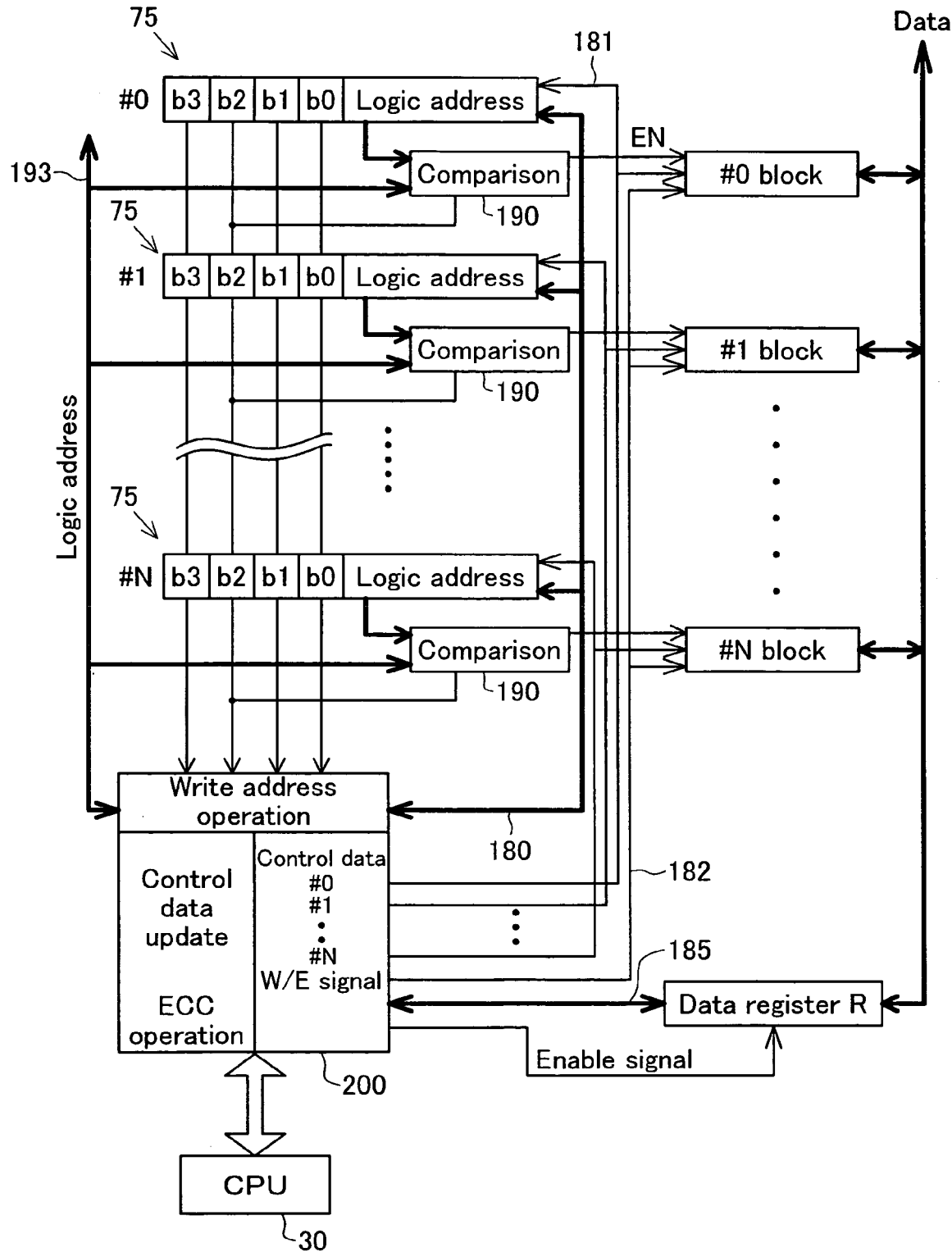
FIG. 12 is an explanatory drawing of the data read operation.

FIG. 12 is an explanatory drawing of the data read operation. FIG. 12 shows part of the external storage device 10, and shows the connection relationship of each component comprising the CPU 30, each block within the flash memory 60, the block management register 75 within the flash controller 70, the address operation unit 200 that is part of the flash controller 70, and the comparator 190.

As shown in the drawing, the block management register 75 comprises a logical address register, and is connected to with the write address operation unit 200 via the address bus 180 and the enable signal line 181. The address signals of the logical address commanded from the CPU 30 is output to the address bus 180 connected with the address operation unit 200. This signal (address) is written to one logical address register which received the enable signal from the address operation unit 200.

The address operation unit 200 comprises the gates 90, 93, and 96 for selecting blocks that can be used for writing shown in FIG. 3, the A side address operation unit 100 and B side address operation unit 110, and the block specification circuit shown in FIG. 8. In other words, the address operation unit 200 specifies a block for writing, reading, or erasing specified data, and does processing corresponding to the command from the CPU 30. This address operation unit 200, in addition to the logical address register, is connected to each block via the data bus 185 and the data register R, and to each comparator 190 via the logical address bus 193.

When the specified data from the CPU 30 is written, the address operation unit 200 outputs an operation enable signal via the enable signal line 181 to the selected block and a write enable signal to the logical address register of the block management register 75 corresponding to that block, and also outputs a write enable signal via the enable signal line 182. In this way, specified data is written via the data bus 185 and the data register R to the block that received the enable signal. Note that the enable signal line 182 outputs a signal for differentiating the data write and erase, and it also used when erasing data within a specified block.

The flash controller 70 comprises comparators 190 in a number corresponding to the block management registers 75. The comparators 190, in addition to the connection with the address operation unit 200 described above, are also connected to the logical address register and the use possibility register b2 of the block management register 75, and input are the address from the logical address register, the logical address via the logical address bus 193, and the value of the use possibility register b2. The comparator 190 compares the address and the logical address, and when both of these match, outputs a read enable signal EN to the block. In other words, the comparator 190 is used when reading specified data, and is used to specify the physical block at which the desired data is stored. The block that receives the enable signal EN outputs the stored data via the data register R of the flash memory 60 to the data bus 185. The desired data is read in this way. Used for this kind of data read is a burst mode that reads data continuously with one address specification.

Note that the enable signal from the comparator 90 to one block (signal for specifying the block) is also used for updating of the values of the use possibility register b2 and the erase count registers b1 and b0. For example, by switching the block number signal Bi for specifying the block used for writing described above and the signal for specifying the block from the comparator 190 according to the write commands and erase commands from the flash controller 70, it is possible to constitute the write circuit using the AND gates and the D type flip-flop circuits described above.

For the external storage device 10 with this kind of constitution, for example, the address operation unit 200 that receives a write command of, "write data A to the address 0100H" from the CPU 30 selects the block #1, for example, as the block for which write is possible from the management information register of each block management register 75. The address operation unit 200 outputs enable signals via the enable signal line 181 to the #1 logical address register and the block. As a result, "0100H" is written via the address bus 180 to the #1 logical address register and "data A" is written via the data bus 185 and the data register R of the flash memory 60 to the #1 block.

On the other hand, for example, the address operation unit 200 that receives the read command of, "read the data of the address 0100H" from the CPU 30 outputs "0100H" to the logical address bus 193. The comparators 190 to which this is input compare in a batch the address signal written to the logical address register managing itself and the input values (logical address signals). When the comparison results are determined to be an address match for the comparator 190 for maintain the #1 block, the comparator 190 for managing the #1 block outputs the enable signal EN to the #1 block. The "data A" written to the #1 block is output to the data bus 185 via the data register R. This comparator 190 uses an existing magnitude comparator for outputting signals only when two address data are compared and match. The comparator 190 inputs the value of the use possibility register b2, so when unused (in other words, when the register b2 is the value 1), the comparison determination is not performed.

With the flash memory 60, blocks are selected considering the already erased erase count during data write, so the physical block number for which data corresponding to a certain logical address is written is changed with each data update. With this embodiment, a logical address register is comprised, and the logical address of the data written to one block is stored. To read the data of a specified logical address, the comparison of logical addresses for which reading is desired is performed in batch form on all the blocks for which data write has been performed. Therefore, read is executed instantly no matter which block within the flash memory 60 the desired data is written to.

Note that with this embodiment the files were handled using block units, but it is also possible to handle them using page units. In this case, a 6-bit counter can be provided within the external storage device 10, and the carrying of the most significant of the 6 bits can be reflected in the use possibility register b2. In other words, counting is done each time data is written to one page, it is determined that all the pages of one block are used by the carrying of the most significant bit, and with that block being in use, the value 0 is established for the use possibility register b2. This counter value may also be managed by the CPU 30. By working in this way, it is possible to recognize the remaining page count of the block that was accessed last, and to make efficient use of the memory space.

It is also possible to have data read when handing in page units performed by having the CPU 30 manage the upper address for specifying the block and the lower address for specifying the page, and when reading the desired data, performing this by having the comparator 190 use the upper address for specifying the physical block, and using the lower address for specifying the page within the specified block. Then, during data update, the data of the specified page is read, and the corrected data is written to another page. The address of the page for which the storage location is physically changed may also be managed on the CPU 30 side.

D. VARIATION EXAMPLES

With the external storage device of this embodiment, the constitution was such that the blocks used for writing are selected and data is written using hardware, and data that specified a block in which the desired data is stored is read using hardware, but it is also possible to perform the specification of the block in which the desired data is stored using software.

Figure 13:
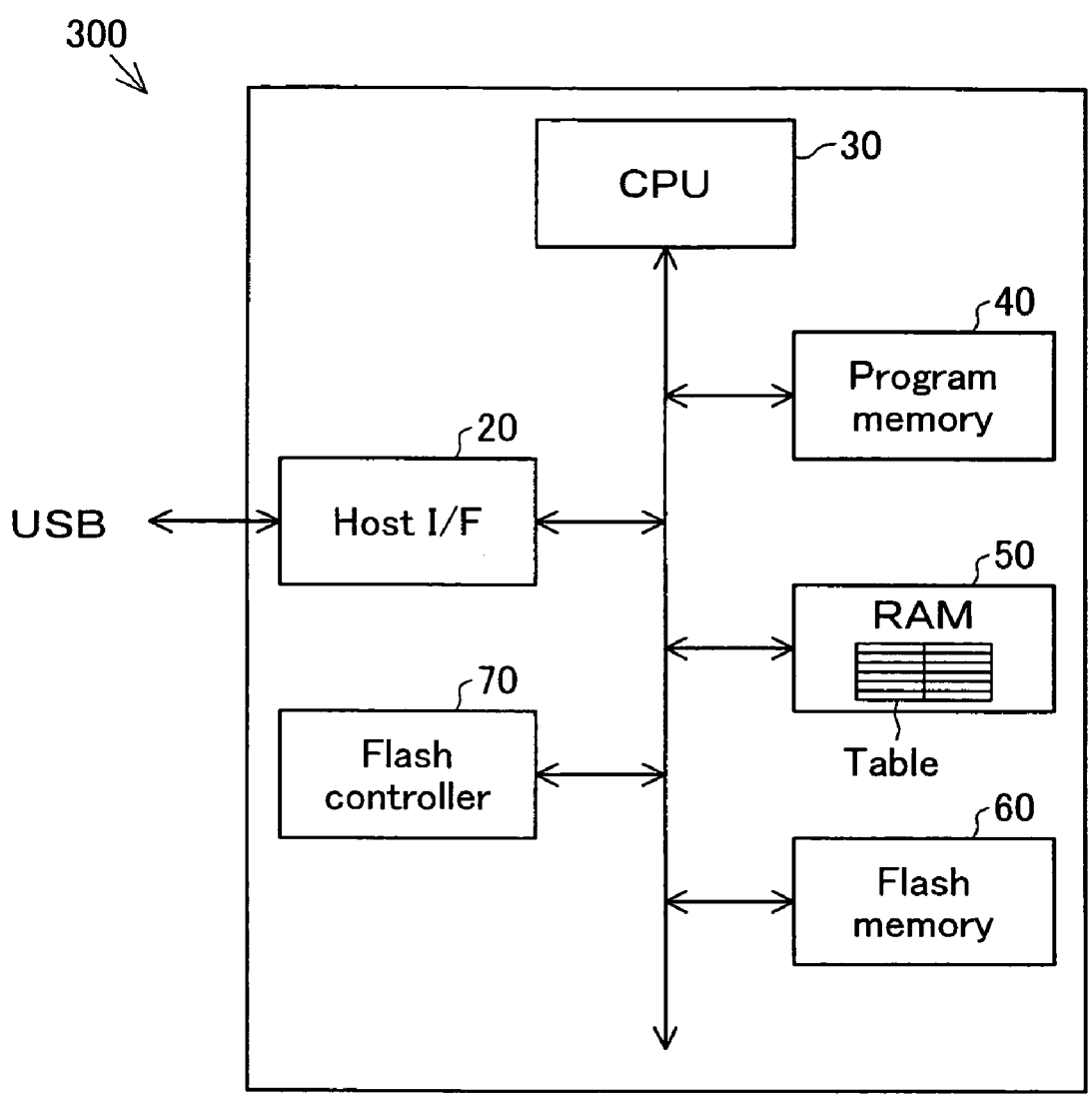
FIG. 13 is an overall block diagram showing the constitution of the external storage device that executes block specification using software.

FIG. 13 shows the constitution of the external storage device that executes the specification of the block in which the desired data is stored using software. As shown in the drawing, this external storage device 300 has a different placement of the flash memory 60 compared to the external storage device 10 shown in FIG. 1, and is a so-called general purpose type external storage device. With the external storage device 300 of FIG. 13, the codes are the same as those of the external storage device 10 of FIG. 1, so the description of each part is omitted.

This external storage device 300, the same as with the first embodiment, specifies the block within the flash memory 60 used for writing by the flash controller 70, and outputs the physical address of that block to the CPU 30. The CPU 30 creates within the RAM 50 a table that correlates the logical addresses from the external device and the physical address from the flash controller 70.

This table is updated with each command such as reading or writing of data from the external device. When reading the desired data, this table is referenced and the block is specified, and data is read from that block. By executing data processing using this kind of table, it is possible to constitute the external storage device 300 without comprising the logical address register, the comparator 190, or the like shown in FIG. 12.

Note that each value that constitutes the table may secure a specified storage area in the flash memory 60 and be stored in that area. By working in this way, it is possible to do non-volatile storage of the table values even when the power is cut off. It is also possible to store a plurality of table values and to store them so that error revision is possible.

The aspects of implementing the present invention were described above, but the present invention is not limited to the aspects implemented in this way, and various embodiments can of course be obtained within a scope that does not stray from the key points of the present invention. With this embodiment, a specified area of the flash memory was used as the block management register, and write management information was added to the block management register with each update, but these management information may also be held in the RAM, and be written to a specified area of the flash memory at specified intervals or when there is an instruction to end activation of the external storage device.

What is claimed is:

1. An external storage device comprising:
   a flash memory having a plurality of blocks for storing data;
   a block management register and n operation gates provided at each of the blocks of the flash memory;
   n control circuits;
   block selection unit; and
   storage unit that stores data to the blocks of the flash memory,
   wherein the block management register includes a use possibility register for indicating the use status of the block, and n (n is an integer of 2 or greater) erase count registers for indicating the erase count value of the block data;
   the n operation gates output result values that indicate erase count value of the usable blocks based on logical product of a value of use possibility register and each of the erase count register values;
   the n control circuits classify the usable blocks into n groups according to the erase count value based on the outputted result values of the operation gates;
   each of the control circuits has:
      a first circuit for outputting signals for indicating the usable block among the blocks included in one of the groups in a constitution sequence; and
      a second circuit for outputting signals for indicating that there are no usable blocks within the one group;
   the block selection unit specifies one group among n groups in a cyclic sequence for each output timing of the second circuit of the control circuit and selects the usable block based on the output signal of the first circuit; and
   the storage unit stores the data in the selected block.

2. The external storage device in accordance with claim 1, wherein the n is 2;
   the erase count registers of the block management register consist of:
      a first erase count register for indicating that the block erase count is 0 times or an even number of times, and
      a second erase count register for indicating that the block erase count is an odd number of times;
   the two operation gates include:
      a first gate for outputting the result of the logical product operation of the value of use possibility register and each of the first erase count register values, and
      a second gate for outputting the result of the logical product operation of the value of use possibility register and the second erase count register values,
   the control circuits consist of
      a first control circuit for inputting the output result value of the first gate and for indicating the group for which the erase count of the usable block is 0 times or an even number of times, and
      a second control circuit for inputting the output result value of the second gate and for indicating the group for which the erase count of the usable block is an odd number of times; and
   the block selection unit alternates the group for selecting the usable block between groups indicated by the first control circuit and the second control circuit and outputs the usable block number based on the output timing of the second circuit.

3. The external storage device in accordance with claim 1, wherein the block management register has a state register that outputs a value indicating whether or not the block is defective; and
   the n operation gates perform the logical product operation of the value of the use possibility register, each of the erase count register values and the value of the state register.

4. The external storage device in accordance with claim 2, wherein the block management register comprises a state register that outputs a value indicating whether or not the block is defective; and
   the n operation gates perform the logical product operation of the value of the use possibility register, each of the erase count register values and the value of the state register.

5. The external storage device in accordance with claim 1, wherein the block management register includes a logical address register for storing the logical address that is the address on a virtual memory space allocated as the data storage area, and
   the external storage device further comprises:
      for each block, a comparator for comparing a specified logical address and the address stored in the logical address register and outputting the result of the comparison; and
      a controller for storing the logical address in the logical address register corresponding to a one block at the timing of writing data to the block, and when the data written in the logical address is required to read, specifying the block in which the data is written and reading the data from the block based on the result output by the comparator.

6. The external storage device in accordance with claim 2, wherein the block management register includes a logical address register for storing the logical address that is the address on a virtual memory space allocated as the data storage area, and the external storage device further comprises:

for each block, a comparator for comparing a specified logical address and the address stored in the logical address register and outputting the result of the comparison; and a controller for storing the logical address in the logical address register corresponding to a one block at the timing of writing data to the block, and when the data written in the logical address is required to read, specifying the block in which the data is written and reading the data from the block based on the result output by the comparator.

7. The external storage device in accordance with claim 1, wherein the storage unit that generates a table for representing the correlation between the logical address that is the address in the virtual memory space allocated as the data storage area and the physical address of the block selected by the block selection unit and in which the data is stored, and that stores the data based on the table.

8. The external storage device in accordance with claim 1, wherein the block management register is constituted using non-volatile memory.

9. The external storage device in accordance with claim 1, the external storage device further comprising:

a non-volatile storage that stores a specified value stored in the block management register at a specified timing; and when the power is turned on to the external storage device, the specified value that the non-volatile storage has is transferred to the block management register.

10. The external storage device in accordance with claim 9, wherein the non-volatile storage is configured with an area secured in advance in part of the flash memory.

11. The external storage device in accordance with claim 1, wherein the flash memory has a NAND type structure.

12. The external storage device in accordance with claim 2, wherein the flash memory has a NAND type structure.

13. A method that writes the data to an external device comprising a flash memory configured with a plurality of blocks for storing data and connected to a data bus, the method comprising:

storing information for indicating a use status of the block and an erase count of the block for each of the blocks;

classifying the usable blocks into n (n is an integer of 2 or greater) groups according to the erase count based on the information; and selecting one group among groups in a cyclic, and for one group, writing the data in a block constitution sequence to the usable block belonging to the selected group, and after using the all usable blocks for writing, selecting another group in the specified sequence, and writing the data to the selected block.

* * * * *